United States Patent
Yoshizawa et al.

(10) Patent No.: US 9,742,413 B2
(45) Date of Patent: Aug. 22, 2017

(54) ELECTRONIC DEVICE AND INFORMATION PROCESSING APPARATUS

(71) Applicant: FUJITSU LIMITED, Kawasaki-shi, Kanagawa (JP)

(72) Inventors: Yoshiharu Yoshizawa, Kawasaki (JP); Masazumi Maeda, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/743,153

(22) Filed: Jun. 18, 2015

(65) Prior Publication Data
US 2016/0028409 A1    Jan. 28, 2016

(30) Foreign Application Priority Data
Jul. 25, 2014    (JP) .................................. 2014-152253

(51) Int. Cl.
*H03L 7/08*    (2006.01)
*H03L 7/081*    (2006.01)

(52) U.S. Cl.
CPC .................................. *H03L 7/0816* (2013.01)

(58) Field of Classification Search
CPC ........................................................ H03L 7/08
See application file for complete search history.

(56) References Cited

U.S. PATENT DOCUMENTS

| | | | | |
|---|---|---|---|---|
| 5,079,519 A * | 1/1992 | Ashby | ................... | H03L 7/0814 327/231 |
| 6,104,214 A * | 8/2000 | Ueda | .................. | H03K 3/35613 326/112 |
| 6,445,231 B1 * | 9/2002 | Baker | ................... | H03L 7/0814 327/158 |
| 7,696,799 B2 * | 4/2010 | Kim | ..................... | H03L 7/0814 327/158 |
| 2007/0069780 A1 | 3/2007 | Kim | | |
| 2013/0049831 A1 | 2/2013 | Nedachi | | |

FOREIGN PATENT DOCUMENTS

| JP | 7-502394 | 3/1995 |
|---|---|---|
| JP | 2007-97140 | 4/2007 |
| JP | 2013-46271 | 3/2013 |
| WO | 93/13602 | 7/1993 |

* cited by examiner

*Primary Examiner* — Hai L Nguyen
(74) *Attorney, Agent, or Firm* — Staas & Halsey LLP

(57) ABSTRACT

An electronic device includes: a voltage controlled delay line including delay elements configured to delay an input clock signal and output the clock signal, a delay control element configured to control a delay time of the clock signal delayed by the delay elements in accordance with a control voltage, a delay sensitivity adjustment circuit configured to adjust a ratio of an amount of change of the delay time to an amount of change of the control voltage, and a plurality of delay circuits; and a control voltage generation circuit configured to compare a phase of an output signal of any one of the plurality of delay circuits and a phase of the clock signal, generate the control voltage so as to match the phase of the output signal and the phase of the clock signal based on the comparison result, and output the control voltage to the delay control element.

4 Claims, 8 Drawing Sheets

ELECTRONIC DEVICE AND INFORMATION PROCESSING APPARATUS

CROSS-REFERENCE TO RELATED APPLICATION

This application is based upon and claims the benefit of priority of the prior Japanese Patent Application No. 2014-152253, filed on Jul. 25, 2014, the entire contents of which are incorporated herein by reference.

FIELD

The embodiments discussed herein are related to an electronic device, and an information processing apparatus.

BACKGROUND

In electronic parts, such as a semiconductor device, and the like, a delay locked loop (DLL) circuit is used in order to obtain a desired delay. For example, using a DLL circuit, a delayed signal is produced such that a clock signal is shifted by a desired phase. Then a data signal latched by the delayed signal is selectively output so that it becomes possible to output high-speed serial data. A digital DLL circuit, which is one form of DLL circuits, has a delay line to which a plurality of delay elements are connected in series, and the amount of delay is adjusted by adjusting the number of stages of the delay elements in the delay line.

Also, it is known that a delay element including a differential input transistor, an analog control transistor circuit, and a digital control transistor circuit is disposed on a delay line so that a delay time of the delay element on the delay line is adjusted by an analog control voltage. A differential input clock signal is applied to the differential input transistor. One end of the analog control transistor circuit is connected to a power supply end, and the analog control transistor circuit adjusts the amount of fine delay in response to the analog control voltage. The digital control transistor circuit is connected between the analog control transistor circuit and the differential input transistor, and the digital control transistor circuit adjusts the amount of coarse delay in response to a digital code.

A phase-locked loop circuit capable of operating at a wide range of frequencies, that is to say, from a low-speed transmission system having a frequency of about a few Gbps to a high-speed transmission system having a frequency of about tens of Gbps, is desired. In a phase-locked loop circuit capable of operating at a wide range of frequencies, a problem might occur with a relationship between delay sensitivity, which is a ratio of the amount of change in the control voltage controlling the delay time of the voltage controlled oscillator (VCO), and jitter characteristics. That is to say, if an attempt is made to achieve sufficient delay sensitivity at the time of low-speed transmission, jitter characteristics might be deteriorated at the time of high-speed transmission. Also, if an attempt is made to have good jitter characteristics at the time of high-speed transmission, sufficient delay sensitivity might not be achieved at the time of low-speed transmission.

The followings are reference documents.
[Document 1] Japanese Laid-open Patent Publication No. 2007-97140,
[Document 2] Japanese National Publication of International Patent Application No. 7-502394, and
[Document 3] Japanese Laid-open Patent Publication No. 2013-46271.

SUMMARY

According to an aspect of the invention, an electronic device includes: a voltage controlled delay line including delay elements configured to delay an input clock signal and output the clock signal, a delay control element configured to control a delay time of the clock signal delayed by the delay elements in accordance with a control voltage, a delay sensitivity adjustment circuit configured to adjust a ratio of an amount of change of the delay time to an amount of change of the control voltage, and a plurality of delay circuits connected in series; and a control voltage generation circuit configured to compare a phase of an output signal of any one of the plurality of delay circuits and a phase of the clock signal, generate the control voltage so as to match the phase of the output signal and the phase of the clock signal based on the comparison result, and output the control voltage to the delay control element.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the following, a description will be given of an electronic device and an information processing apparatus with reference to the drawings. Note that the technical scope of the present disclosure is not limited to those embodiments, but extends to equivalence of the disclosure described within the scope of the appended claims.

Figure 1:
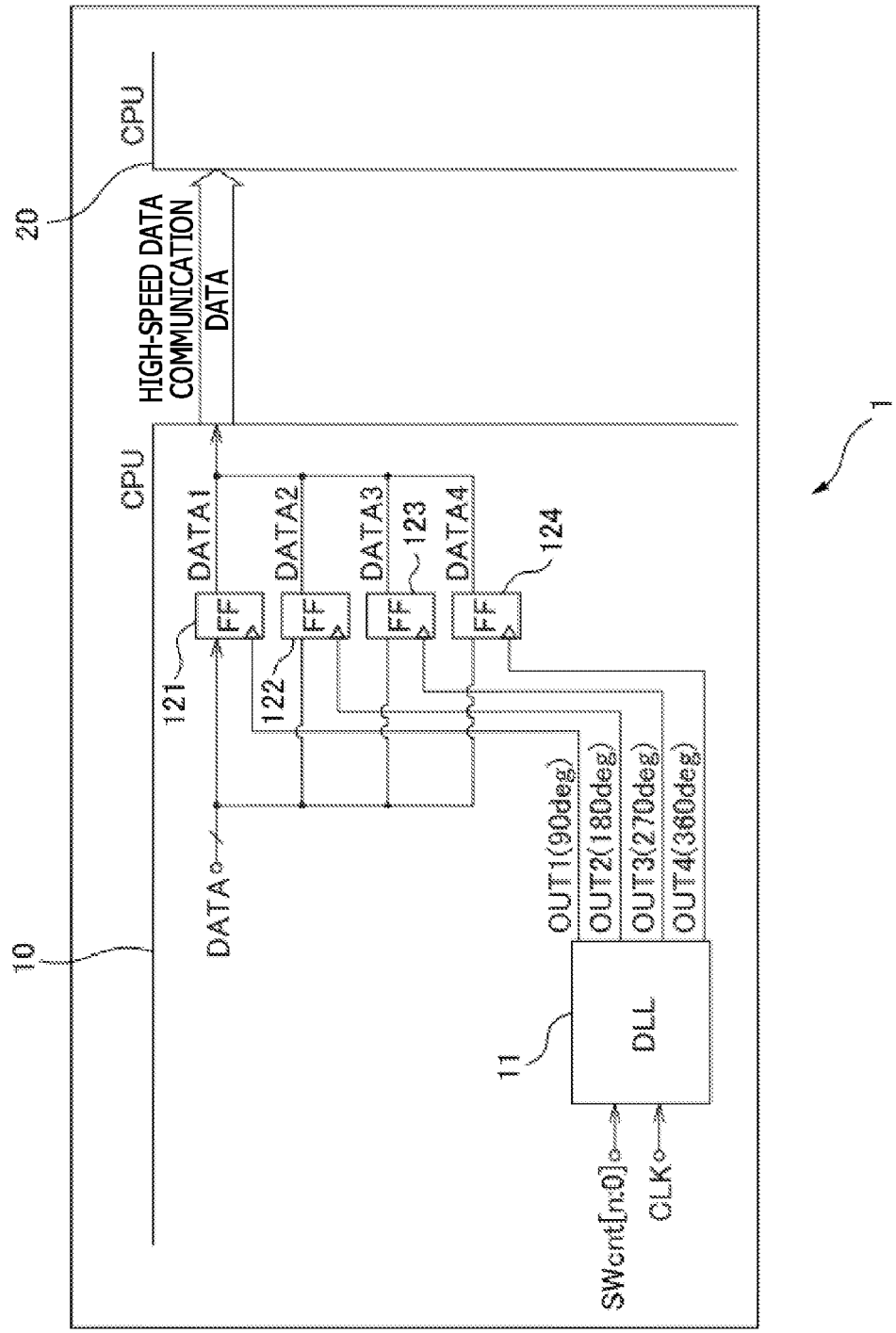
FIG. 1 is a circuit block diagram of an information processing apparatus according to an embodiment.

FIG. 1 is a circuit block diagram of an information processing apparatus according to an embodiment.

An information processing apparatus 1 includes a first Central Processing Unit (CPU) 10, and a second CPU 20. The first CPU 10 includes a DLL circuit 11, and a first flip-flop 121 to a fourth flip-flop 124. The DLL circuit 11 delays an input clock signal CLK, and generates four output signals OUT1 to OUT4 having different phases with each other by 90 degrees, respectively, and outputs the output signals to the corresponding clock terminals of the first flip-flop 121 to the fourth flip-flop 124. The output terminals of the first flip-flop 121 to the fourth flip-flop 124 are connected through a multiplexer. Each of the first flip-flop 121 to the fourth flip-flop 124 latches the input data signal DATA, which has been input to a corresponding data terminal, by the corresponding one of the output signals OUT1 to OUT4 of the DLL circuit 11, and outputs the data signal as output data signals DATA1 to DATA4.

Figure 2:
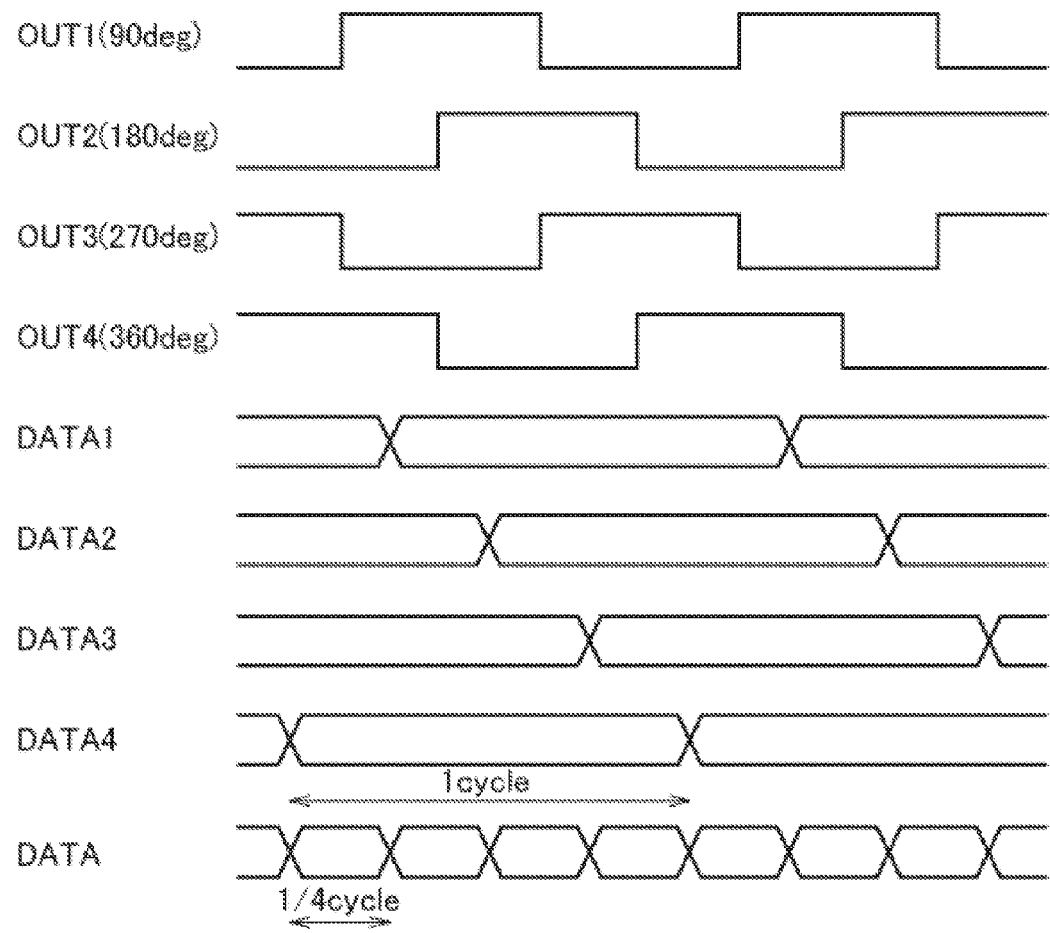
FIG. 2 is a timing chart illustrating operation of the CPU illustrated in FIG. 1.

FIG. 2 is a timing chart illustrating operation of the first CPU 10 illustrated in FIG. 1.

The first flip-flop 121 latches the input data signal DATA by the first output signal OUT1, which is produced by delaying the clock signal CLK so as to have a phase shifted by 90 degrees, and outputs the first output data signal DATA1. The second flip-flop 122 latches the input data signal DATA by the second output signal OUT2, which is produced by delaying the clock signal CLK so as to have a phase shifted by 180 degrees, and outputs the second output data signal DATA2. The third flip-flop 123 latches the input data signal DATA by the third output signal OUT3, which is produced by delaying the clock signal CLK so as to have a phase shifted by 270 degrees, and outputs the third output data signal DATA3. The fourth flip-flop 124 latches the input data signal DATA by the fourth output signal OUT4, which is produced by delaying the clock signal CLK so as to have a phase shifted by 360 degrees and outputs the fourth output data signal DATA4.

Each of the output terminals of the first flip-flop 121 to the fourth flip-flop 124 is connected through a multiplexer, and thus the first CPU 10 selectively outputs each of the first output data signal DATA1 to the fourth output data signal DATA4 to the second CPU 20.

Figure 3:
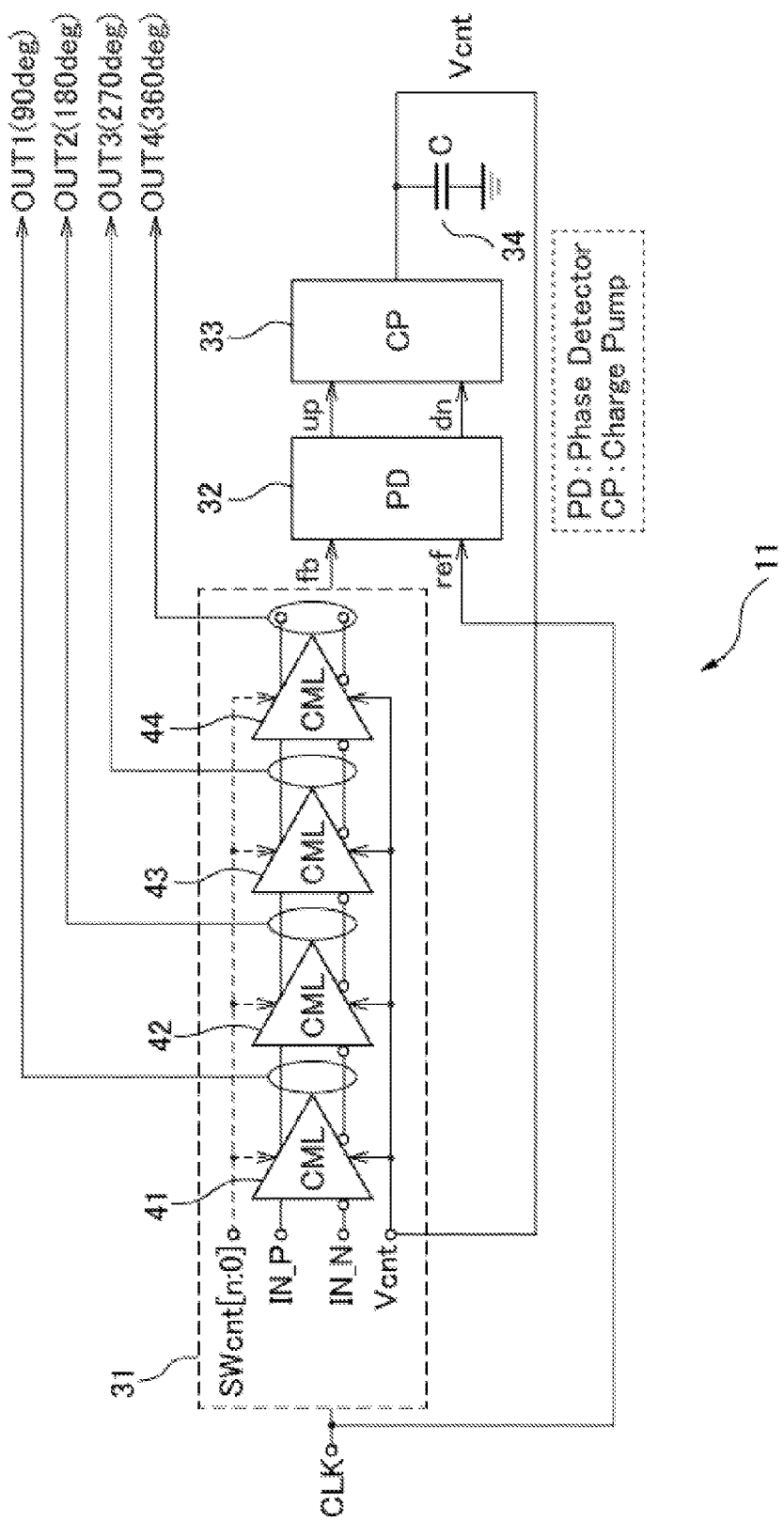
FIG. 3 is an internal circuit block diagram of the DLL circuit illustrated in FIG. 1.

FIG. 3 is an internal circuit block diagram of the DLL circuit 11.

The DLL circuit 11 includes a voltage controlled delay line 31, a phase detector 32, a charge pump 33, and a capacitor 34. The voltage controlled delay line 31 is configured by current mode logic (CML) circuits, which are connected in series with each other, and includes the first delay circuit 41 to the fourth delay circuit 44 having the same configuration. The voltage controlled delay line 31 receives the input of the clock signal CLK, and generates and outputs the output signals OUT1 to OUT4 having phases that are different with each other by 90 degrees. The phase detector 32 compares the input clock signal CLK, and the fourth output signal OUT4, which was delayed to have a phase shifted from the phase of the clock signal CLK by 360 degrees, and outputs the comparison result to the charge pump 33. The charge pump 33 charges and discharges electrical charge of the capacitor 34 based on the comparison result input from the phase detector 32. The voltage between the terminals of the capacitor 34 is fed back to each of the first delay circuit 41 to the fourth delay circuit 44 as a control voltage Vcnt. A delay sensitivity adjustment signal SWcnt [n:0] is a signal that adjusts delay sensitivity, which is a ratio of the amount of change in delay time of each of the first delay circuit 41 to the fourth delay circuit 44 to the amount of change of the control voltage Vcnt. The phase detector 32, the charge pump 33, and the capacitor 34 form a control voltage generation circuit that generates the control voltage, and outputs the control voltage to the delay control element 55. That is to say, the control voltage generation circuit compares the phase of the output signal of the phase of the fourth delay circuit 44, and the phase of the clock signal, and generates a control voltage so as to match the phase of the output signal and the phase of the clock signal based on the comparison result, and outputs the control voltage to the delay control element 55.

In the DLL circuit 11, the clock signal is subjected to feed back control such that the phase of the clock signal matches the phase of the fourth output signal OUT4, which is delayed so as to have a phase shifted by 360 degrees from the phase of the clock signal. Also, the first delay circuit 41 to the fourth delay circuit 44 of the voltage controlled delay line 31 have the same configuration, and are controlled by the same control voltage Vcnt. The phase of the clock signal CLK matches the phase of the output signal OUT4, and the delay times of the first delay circuit 41 to the fourth delay circuit 44 are the same, and thus the output signals OUT1 to OUT4 of the first delay circuit 41 to the fourth delay circuit 44 become the signals having phases that are shifted 90 degrees with each other, respectively.

Figure 4:
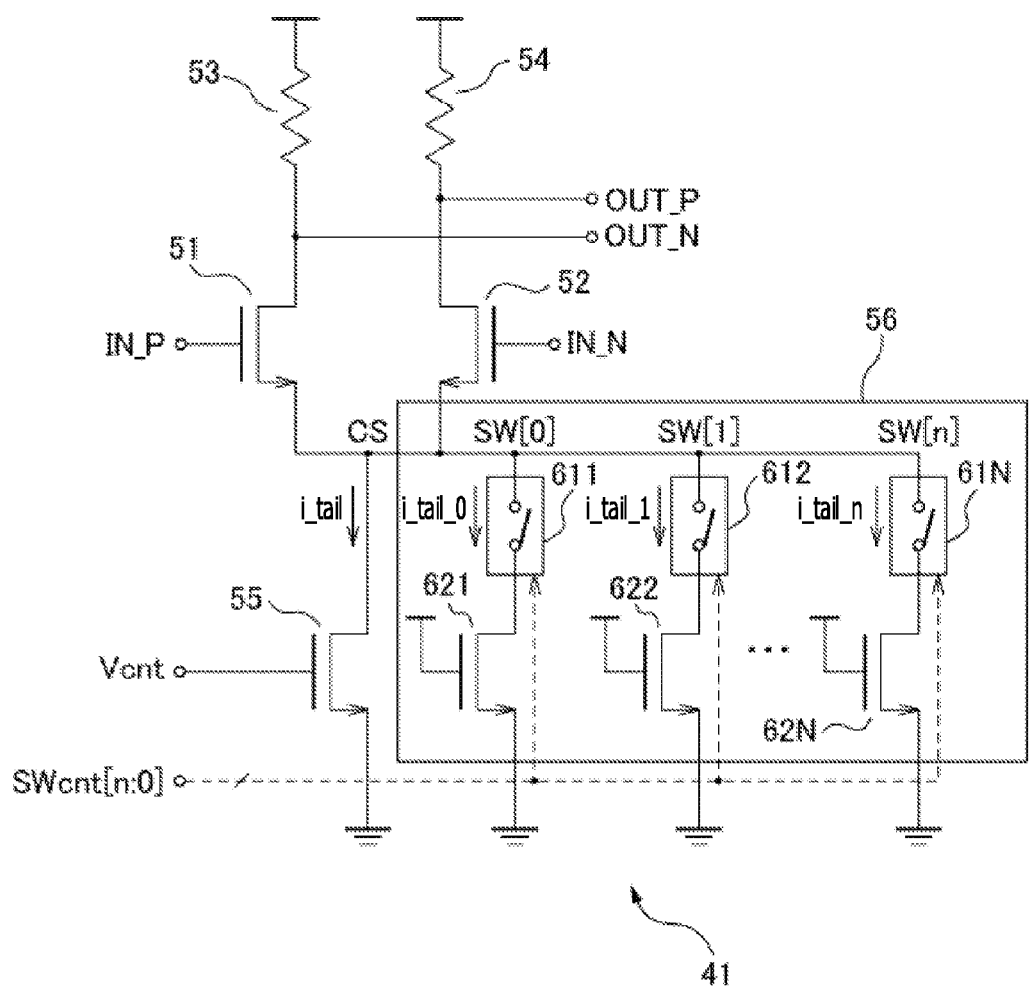
FIG. 4 is an internal circuit block diagram of the delay circuit illustrated in FIG. 3.

FIG. 4 is an internal circuit block diagram of the first delay circuit 41.

The first delay circuit 41 includes a first delay element 51, a second delay element 52, a first resistor element 53, a second resistor element 54, a delay control element 55, and a delay sensitivity adjustment circuit 56.

Each of the first delay element 51 and the second delay element 52 is an nMOS transistor. Input signals IN_P and IN_N, which are generated from the clock signal CLK, and are inverted with each other, are input into the gates of the first delay element 51, and the second delay element 52, respectively, and output signals OUT_P and OUT_N, which are produced by delaying the input signals IN_P and IN_N are output from the drains, respectively. The sources of the first delay element 51, and the second delay element 52 are connected to the delay control element 55, and the delay sensitivity adjustment circuit 56.

One end of the first resistor element 53 is connected to the power source voltage, and the other end is connected to the drain of the first delay element 51. One end of the second resistor element 54 is connected to the power source voltage, and the other end is connected to the drain of the second delay element 52.

The delay control element 55 is an nMOS transistor which is also referred to as a tail transistor, and a control voltage Vcnt corresponding to the voltage between terminals of the capacitor 34 is applied to the gate of the nMOS transistor. The delay control element 55 controls the delay time of the first delay element 51 and the second delay element 52 in accordance with the control voltage Vcnt. The source of the delay control element 55 is grounded, and the drain of the delay control element 55 is connected to the drains of the first delay element 51, and the second delay element 52.

The delay sensitivity adjustment circuit 56 includes the first switching element 61I to the N-th switching element 61N, and the first load element 62I to the N-th load element 62N, which are connected to the first switching element 61I to the N-th switching element 61N in series, respectively. Each of the first switching element 61I to the N-th switching element 61N turns on and off the connection between the first delay element 51 and the second delay element 52, and the first load element 62I to the N-th load element 62N in accordance with the delay sensitivity adjustment signal SWcnt [n:0], respectively. The delay sensitivity adjustment signal SWcnt [n:0] is set to a predetermined value by a control circuit not illustrated in FIG. 4 at the time of initialization after the power to the information processing apparatus 1 is turned on. The gate of each of the first load element 621 to the N-th load element 62N is pulled up, and each of the first switching element 611 to the N-th switching element 61N functions as a resistor element through which a current flows.

Figure 5B:
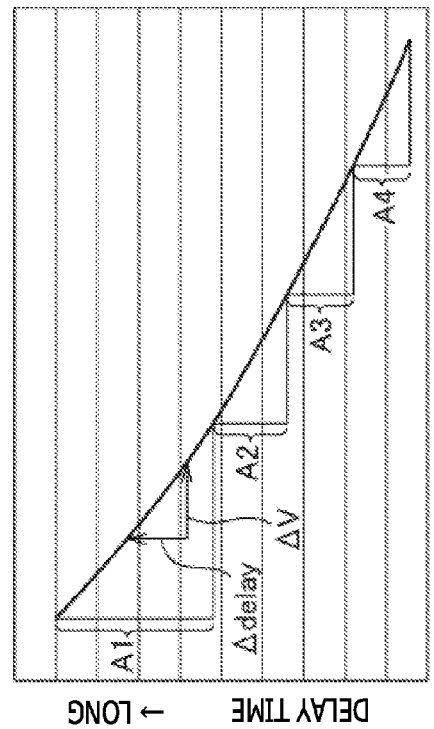
FIG. 5B is a diagram illustrating a relationship between control voltage and delay time of the delay circuit illustrated in FIG. 5A.
Figure 5C:
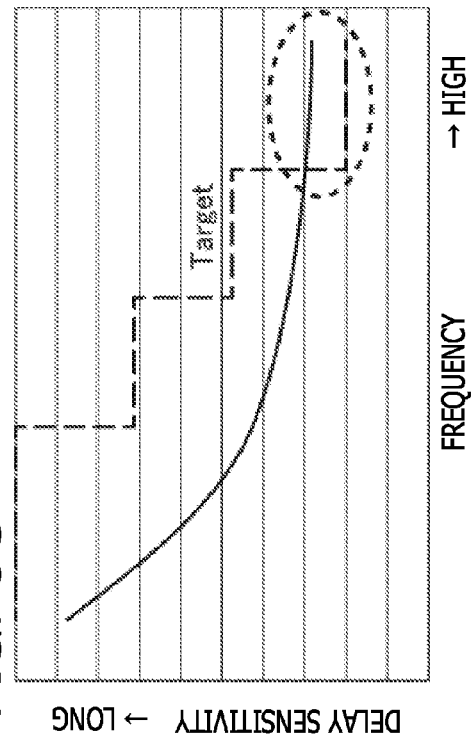
FIG. 5C is a diagram illustrating a relationship between frequency and delay sensitivity of the delay circuit illustrated in FIG. 5A.
Figure 5A:
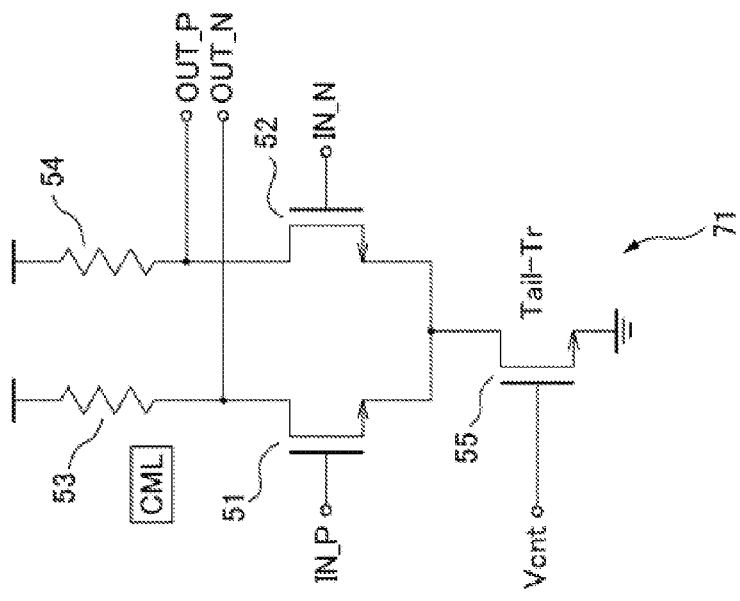
FIG. 5A is an internal circuit block diagram of a delay circuit not including a delay sensitivity adjustment circuit.

FIG. 5A is an internal circuit block diagram of a delay circuit not including the delay sensitivity adjustment circuit 56. FIG. 5B is a diagram illustrating a relationship between the control voltage and the delay time of the delay circuit illustrated in FIG. 5A. FIG. 5C is a diagram illustrating a relationship between the frequency and the delay sensitivity of the delay circuit illustrated in FIG. 5A. In FIG. 5B, the horizontal axis represents the control voltage Vcnt, and the vertical axis illustrates the delay time of the delay circuit illustrated in FIG. 5A. In FIG. 5B, each of A1 to A4 illustrates a delay range of the delay circuit illustrated in FIG. 5A. Reference symbol A1 indicates a delay range when the delay circuit is driven at a lowest frequency, and reference symbol A4 indicates a delay range when the delay circuit is driven at a highest frequency. In FIG. 5C, the horizontal axis represents the operation frequency of the delay circuit illustrated in FIG. 5A, and the vertical axis represents the delay sensitivity denoted by Δdelay/ΔV in FIG. 5B. In FIG. 5C, a solid line represents a relationship between the frequency and the delay sensitivity of the delay circuit illustrated in FIG. 5A, and a broken line represents an example of the delay sensitivity to be targeted, which is determined by the jitter characteristics of the delay circuit.

The delay circuit 71 is different from each of the first delay circuit 41 to the fourth delay circuit 44 in that the delay circuit 71 does not include the delay sensitivity adjustment circuit 56. The higher the control voltage Vcnt, which is input into the gate of the delay control element 55, the higher the drain currents of the first delay element 51 and the second delay element 52, and thus the delay time of the delay circuit 71 becomes smaller. That is to say, if the frequency of the clock signal CLK is relatively low, the control voltage Vcnt becomes a relatively low value, and if the frequency of the clock signal CLK is relatively high, the control voltage Vcnt becomes a relatively high value. Also, the higher the control voltage Vcnt is, the lower the delay sensitivity denoted by Δdelay/ΔV becomes. However, the higher the frequency of the clock signal CLK, the better jitter characteristics are desired, and thus the lower the delay sensitivity is desired. If the delay sensitivity is high, when the control voltage Vcnt varies because of noise, or the like, the delay time of the delay circuit greatly varies, and thus the jitter characteristics of the delay circuit becomes relatively deteriorated.

The delay sensitivity adjustment circuit 56 turns on any of the first switching element 611 to the N-th switching element 61N in order to reduce the drain current of the delay control element 55 so as to decrease the ratio of the amount of change of the delay time to the amount of change of the control voltage Vcnt. That is to say, the delay sensitivity adjustment circuit 56 adjusts the drain current of the delay control element 55 so as to adjust the delay sensitivities of the first delay circuit 41 to the fourth delay circuit 44.

Figure 6:
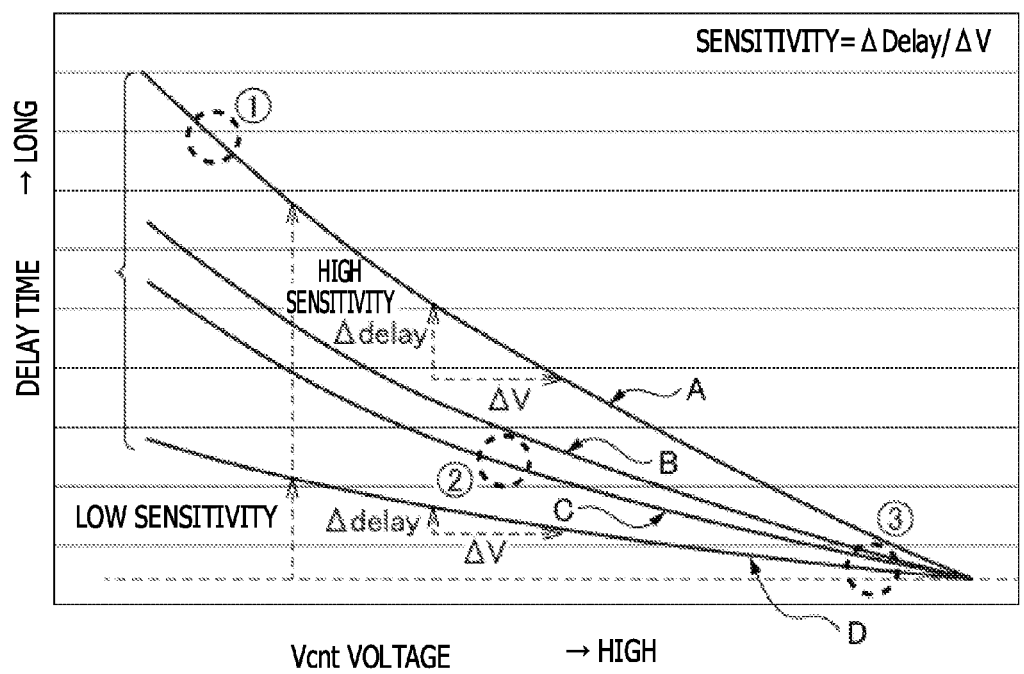
FIG. 6 is a diagram illustrating a relationship between control voltage and delay time of the delay circuit illustrated in FIG. 4 when the number of switching elements to be turned on is changed.

FIG. 6 is a diagram illustrating a relationship between control voltage and delay time of the first delay circuit 41 when the number of switching elements to be turned on is changed. In FIG. 6, the horizontal axis represents control voltage Vcnt, the vertical axis represents delay time of the first delay circuit 41. In FIG. 6, a curve denoted by an arrow A indicates delay time of the first delay circuit 41 when all the switching elements are turned off, and a curve denoted by an arrow B indicates delay time of the first delay circuit 41 when only the first switching element 611 is turned on. A curve denoted by an arrow C indicates delay time of the first delay circuit 41 when the first switching element 611 and the second switching element 612 are turned on, and a curve denoted by an arrow D indicates delay time of the first delay circuit 41 when all the switching elements are turned on.

By increasing the number of switching elements to be turned on, a current that does not go through the delay control element 55 increases, and thus delay sensitivity, which is a ratio of the amount of change of the delay time of the first delay circuit 41 to the amount of change of the control voltage Vcnt, becomes low.

When the control voltage Vcnt is low, and the delay time of the first delay circuit 41 is long, as illustrated by a broken-line circle 1, a delay sensitivity adjustment signal SWcnt [n:0] which turns off all the switching elements is input into the first delay circuit 41. In the first delay circuit 41, all the switching elements are turned off so that all the drain currents of the first delay element 51 and the second delay element 52 flow through the delay control element 55. When the current flowing through the delay control element 55 becomes high, the delay sensitivity of the first delay circuit 41 becomes high. Thus, when the frequency of the clock signal CLK input into the first delay circuit is low, all the switching elements are turned off so that the delay sensitivity becomes high.

When the control voltage Vcnt is an intermediate voltage, any of the first switching element 611 to the N-th switching element 61N are turned on so that the first delay circuit 41 is adjusted to have a desired delay sensitivity. For an example, as illustrated by a broken-line circle 2, a delay sensitivity adjustment signal SWcnt [n:0] that turns on two SWcnt [1:0] is input into the first delay circuit 41. In the first delay circuit 41, any of the first switching element 611 to the N-th switching element 61N are turned on so that the current flowing the delay control element 55 becomes low. The current flowing through the delay control element 55 becomes low so that it is possible to adjust the delay sensitivity of the first delay element. It is possible to set the number of switching elements to be turned on in accordance with the delay sensitivity.

When the control voltage Vcnt is high, and the delay time of the first delay circuit 41 is small, as illustrated by a broken-line circle 3, the delay sensitivity adjustment signal SWcnt [n:0] that turns on all the switching elements is input into the first delay circuit 41. In the first delay circuit 41, all the switching elements are turned on so that it is possible to decrease the current that flows through the delay control element 55. The current that flows through the delay control element 55 becomes low, and thus the delay sensitivity, which is a ratio of the amount of change of the delay time of the first delay circuit to the amount of change of the control voltage Vcnt, becomes low. When the current that flows through the delay control element 55 becomes low, the delay sensitivity of the first delay circuit 41 becomes low. Accordingly, when the frequency of the clock signal CLK input through the first delay circuit is high, all the switching elements are turned on so as to decrease the delay sensitivity.

Figure 7:
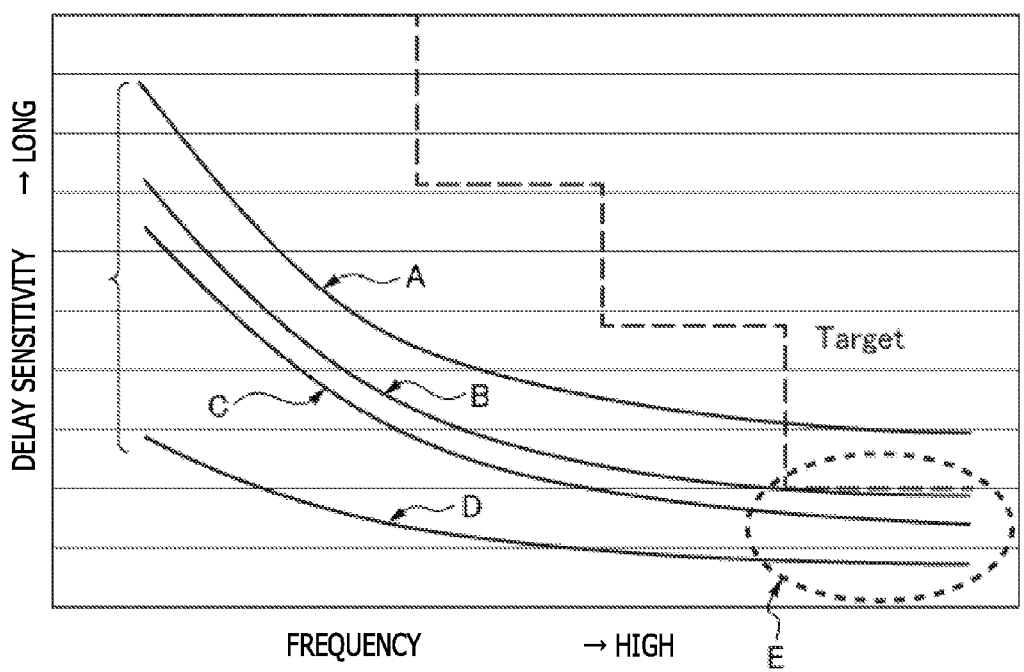
FIG. 7 is a diagram illustrating a relationship between frequency and delay sensitivity of the delay circuit illustrated in FIG. 4.

FIG. 7 is a diagram illustrating a relationship between frequency and delay sensitivity of the first delay circuit 41. In FIG. 7, the horizontal axis represents operation frequency of the first delay circuit 41, and the vertical axis represents delay sensitivity of the first delay circuit 41. In FIG. 7, a solid line indicates a relationship between frequency and delay sensitivity of the first delay circuit 41, and a broken line indicates an example of targeted delay sensitivity, which is determined by jitter characteristics of the first delay circuit 41. In FIG. 7, a curve denoted by an arrow A indicates the delay sensitivity of the first delay circuit 41 when all the switching elements are turned off, and a curve denoted by an arrow B indicates the delay sensitivity of the first delay circuit 41 when only the first switching element 611 is turned on. A curve denoted by an arrow C indicates the delay sensitivity of the first delay circuit 41 when the first switching element 611 and the second switching element 612 are turned on, and a curve denoted by an arrow D indicates the delay sensitivity of the first delay circuit 41 when all the switching elements are turned on.

When the control voltage Vcnt is high, and the delay time of the first delay circuit 41 is small, a current that flows through the delay control element 55 is reduced in order to decrease the delay sensitivity, so that it is possible to have desired jitter characteristics at the time when the clock signal CLK has a high frequency. In the example in FIG. 7, in an area denoted by an arrow E, the delay sensitivity of the first delay circuit 41 when only the first switching element 611 is turned on satisfies the targeted delay sensitivity.

An electronic device according to an embodiment includes delay elements configured to delay a clock signal CLK and output the clock signal, a delay control element configured to control a delay time of the clock signal delayed by the delay elements in accordance with a control voltage, and a delay sensitivity adjustment circuit configured to adjust a ratio of an amount of change of the delay time to an amount of change of the control voltage. The delay sensitivity adjustment circuit adjusts delay sensitivity, which is a ratio of the amount of change of delay time to the amount of change of the control voltage, and thus it is possible for the delay circuit of an electronic device according to an embodiment to have sufficient delay sensitivity at the time of low-speed transmission, and good jitter characteristics at the time of high-speed transmission.

Also, in the electronic device according to the embodiment, the delay sensitivity adjustment circuit adjusts a current flowing through the delay control element in accordance with a delay sensitivity adjustment signal adjusting a ratio of the amount of change of the delay time to the amount of change of the control voltage. The delay sensitivity adjustment circuit of the electronic device according to the embodiment adjusts the current flowing through the delay control element in accordance with the delay sensitivity adjustment signal so that it is possible to adjust the delay sensitivity of the delay circuit in accordance with the frequency of the input clock signal.

Also, the delay sensitivity adjustment circuit of the electronic device according to the embodiment includes switching elements to be turned on or off by the delay sensitivity adjustment signal, and when the switching element is turned off, load elements through which a part of the current flowing through the delay control element when the switching element is turned off flows. The delay sensitivity adjustment circuit of the electronic device according to the embodiment adjusts the current flowing through the delay control element by the switching elements and the load elements, and thus it is possible for the delay sensitivity adjustment circuit to have a simple configuration.

An information processing apparatus according to another embodiment includes the first CPU 10, and the second CPU 20. However, it is also possible to use the delay circuit according to the embodiment for communication between the CPU and the peripheral chip, or communication between peripheral chips. Also, the delay circuit according to the embodiment may use a phase locked loop (PLL) circuit.

In an electronic device according to the embodiment, the delay sensitivity adjustment signal SWcnt [n:0] is set at initialization time after the power source to the information processing apparatus 1 is turned on. However, it may be to dynamically set the delay sensitivity adjustment signal SWcnt [n:0] while the information processing apparatus 1 is in operation.

Also, the delay circuit of the first delay circuit 41 to the fourth delay circuit 44 is a CML including the first delay element 51 and the second delay element 52. However, the delay circuit of the delay circuit according to the embodiment may be formed by another delay element.

Figure 8:
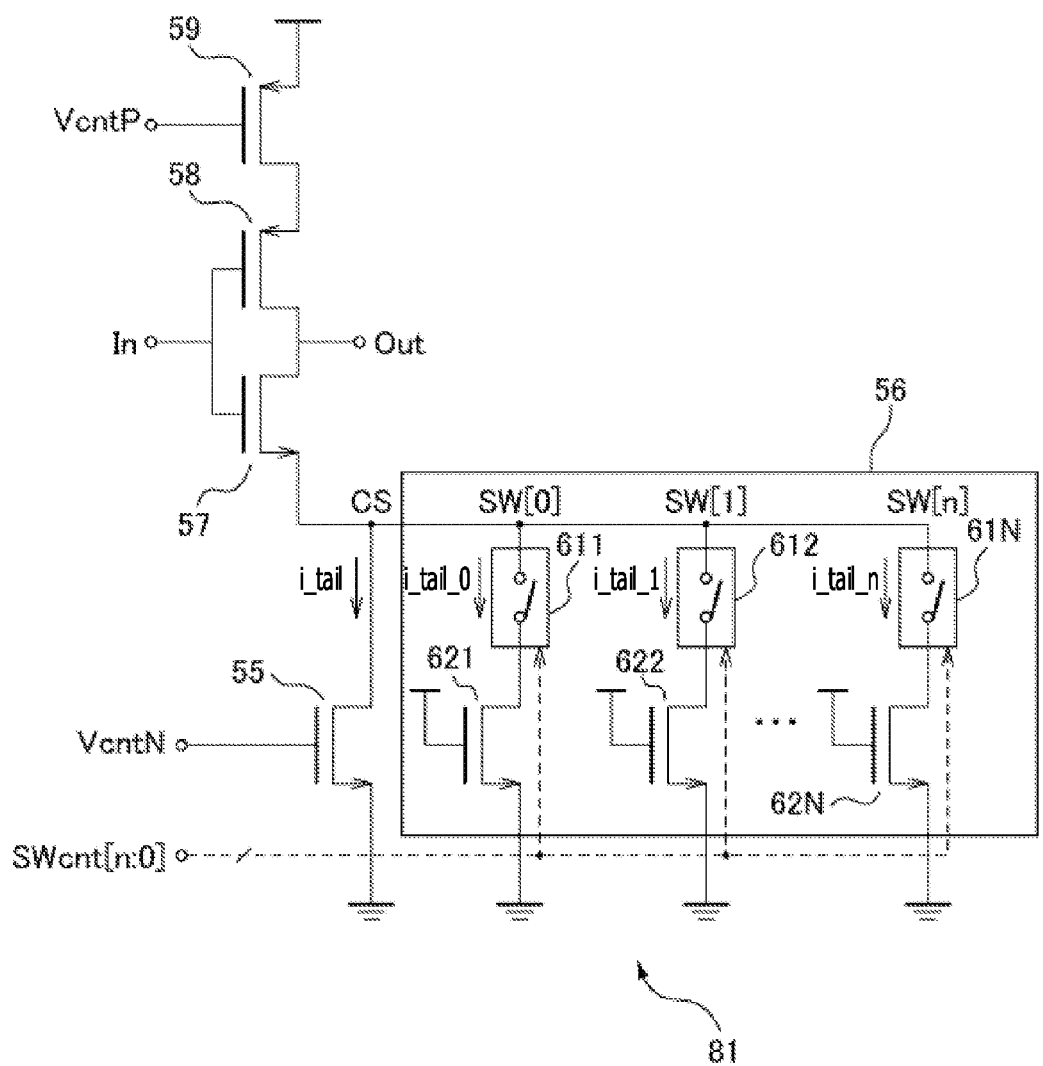
FIG. 8 is an internal circuit block diagram of another delay circuit according to an embodiment.

FIG. 8 is an internal circuit block diagram of another delay circuit according to an embodiment.

A delay circuit 81 is different from the first delay circuit 41 in that the delay circuit 81 includes a first transistor 57 to a third transistor 59 in place of the first delay element 51, the second delay element 52, the first resistor element 53, and the second resistor element 54. The first transistor 57 is an nMOS transistor, the second transistor 58 is a pMOS transistor, and the first transistor 57 and the second transistor 58 form an inversion circuit that inverts the input signal IN, and outputs as an inverted output signal OUT. The third transistor is a pMOS transistor, and controls a rising delay time of the inversion circuit formed by the first transistor 57 and the second transistor 58 in accordance with a rising delay time control voltage VcntP input into the gate. The delay control element 55 controls a falling delay time the inversion circuit formed by the first transistor 57 and the second transistor 58 in accordance with a falling delay time control voltage VcntN input into the gate. The delay sensitivity adjustment circuit 56 adjusts the drain current of the delay control element 55 so as to adjust the delay sensitivity of the inversion circuit formed by the first transistor 57 and the second transistor 58.

Also, each of the first switching element 611 to the N-th switching element 61N, and the first load element 621 to the N-th load element 62N may include a weighted resistance value. For example, it may be formed such that N=3, the resistance values of the first switching element 611 to the third switching element 613 are formed to have a ratio of 4:2:1, respectively, and the resistance value of the first load element 621 to the N-th load element 62N are formed to have a ratio of 4:2:1. The delay sensitivity adjustment circuit 56 includes a plurality of switching elements and load elements having weighted resistance values, respectively, so that the delay circuit of the electronic device according to the embodiment has a circuit configuration capable of fine adjustment of delay sensitivity.

Also, in the electronic device according to the embodiment, the first load element 621 to the N-th load element 62N, whose gate is pulled up, are used as load elements. However, a resistor element formed by a polysilicon layer, or the like may be used as a load element. Also, each of the first switching element 611 to the N-th switching element 61N may be formed by a transistor that functions as a load element so that the first load element 621 to the N-th load element 62N may be omitted.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
   delay line circuitry that delays an input clock signal and outputs a delayed clock signal and includes a plurality of current mode logic circuits coupled in series, each of the plurality of current mode logic circuits including
      a pair of delay elements to which signals are inputted,
      a tail transistor coupled to a connection node of the pair of delay elements that controls a delay time of the pair of delay elements by controlling a current flowing through the tail transistor,
      delay sensitivity adjustment circuitry coupled to the connection node of the pair of delay elements that adjusts the current flowing through the tail transistor to adjust delay sensitivities of the current mode logic circuits; and
   control voltage generation circuitry that
      compares a phase of the delayed clock signal to a phase of the input clock signal, and
      generates a control signal that controls the current flowing through the tail transistor based on the comparison result.

2. The electronic device according to claim 1, wherein the delay sensitivity adjustment circuitry includes
   a plurality of switching elements to be turned on or off by a delay adjustment signal, and
   a plurality of load elements through which a part of a current flowing through the delay control element when the switching element is turned off flows when the switching element is turned on.

3. The electronic device according to claim 2, wherein the plurality of switching elements and the plurality of load elements have individually weighted resistance values.

4. An information processing apparatus comprising:
   a DLL circuit configured to delay a clock signal, the DLL circuit including
   delay line circuitry that delays an input clock signal and outputs a delayed clock signal and includes a plurality of current mode logic circuits coupled in series, each of the plurality of current mode logic circuits including
      a pair of delay elements to which signals are inputted,
      a tail transistor coupled to a connection node of the pair of delay elements that controls a delay time of the pair of delay elements by controlling a current flowing through the tail transistor,
      delay sensitivity adjustment circuitry coupled to the connection node of the pair of delay elements that adjusts the current flowing through the tail transistor to adjust delay sensitivities of the current mode logic circuits; and
   control voltage generation circuitry that
      compares a phase of the delayed clock signal to a phase of the input clock signal, and
      generates a control signal that controls the current flowing through the tail transistor based on the comparison result;
   and
   a latch circuit that latches a data signal by the clock signal delayed by the DLL circuit.

* * * * *